United States Patent
Song et al.

(10) Patent No.: US 6,707,069 B2
(45) Date of Patent: Mar. 16, 2004

(54) LIGHT EMISSION DIODE PACKAGE

(75) Inventors: Kyung Sub Song, Seoul (KR); Jong Pil Cheon, Kyungki-do (KR)

(73) Assignee: Samsung Electro-Mechanics Co., LTD, Kyungki-do (KR)

( * ) Notice: Subject to any disclaimer, the term of this patent is extended or adjusted under 35 U.S.C. 154(b) by 0 days.

(21) Appl. No.: 10/173,120

(22) Filed: Jun. 18, 2002

(65) Prior Publication Data

US 2003/0116769 A1 Jun. 26, 2003

(30) Foreign Application Priority Data

Dec. 24, 2001 (KR) ........................................ 2001-83876

(51) Int. Cl.[7] .............................................. H01L 27/15
(52) U.S. Cl. .............................. 257/79; 257/13; 257/98; 257/99; 257/103; 257/433; 257/434; 257/704
(58) Field of Search ..................... 257/13.79–103, 257/433, 434, 675, 676, 704, 706, 918

(56) References Cited

U.S. PATENT DOCUMENTS

| 4,013,915 | A | * | 3/1977 | Dufft ............................ 313/499 |
| 4,826,271 | A | * | 5/1989 | Takahashi et al. ............ 350/6.8 |
| 4,935,665 | A | * | 6/1990 | Murata ......................... 313/500 |
| 5,177,593 | A | * | 1/1993 | Abe .............................. 257/98 |
| 5,226,723 | A | * | 7/1993 | Chen ............................ 362/241 |
| 5,294,487 | A | * | 3/1994 | Ohashi et al. ............... 428/308.4 |
| 5,298,768 | A | * | 3/1994 | Okazaki et al. ................. 257/81 |
| 5,534,718 | A | * | 7/1996 | Chang ........................... 257/98 |
| 6,121,637 | A | * | 9/2000 | Isokawa et al. ................ 257/99 |
| 6,274,890 | B1 | * | 8/2001 | Oshio et al. .................. 257/98 |
| 6,429,464 | B1 | * | 8/2002 | Lin .............................. 257/99 |
| 6,483,161 | B1 | * | 11/2002 | Kuhara et al. ............... 257/433 |
| 6,501,103 | B1 | * | 12/2002 | Jory et al. ................... 257/100 |
| 6,548,832 | B1 | * | 4/2003 | Sakamoto et al. ............. 257/88 |
| 2003/0020399 | A1 | * | 1/2003 | Moller et al. ................ 313/504 |

\* cited by examiner

Primary Examiner—David Nelms
Assistant Examiner—Andy Huynh
(74) Attorney, Agent, or Firm—Lowe Hauptman Gilman & Berner LLP

(57) ABSTRACT

An LED package, made of ceramic substrates and having a reflective metal plate, has a first ceramic substrate, which has a chip mounting area on its top surface, and is provided with a predetermined conductive pattern formed around the chip mounting area. One or more LED chips are seated on the chip mounting area of the first ceramic substrate, and are connected to the conductive pattern. A second ceramic substrate is mounted on the top surface of the first ceramic substrate and has a cavity at a position corresponding to the chip mounting area. The reflective metal plate is set in the cavity of the second ceramic substrate to surround the LED chips. The reflective metal plate acts as a heat sink for dissipating heat from the LED chips.

6 Claims, 8 Drawing Sheets

LIGHT EMISSION DIODE PACKAGE

BACKGROUND OF THE INVENTION

1. Field of the Invention

The present invention relates, in general, to light emission diode packages with reflective plates of metal and, more particularly, to a light emission diode package provided with a reflective plate of metal for accomplishing an improved heat dissipation effect, in addition to easily controlling its luminance and angular distribution of the luminance.

2. Description of the Prior Art

As well known to those skilled in the art, light emission diode packages (herein below, referred to simply as "LED packages") are semiconductor devices, which have LED chips acting as light sources and produced by changing the physical and chemical characteristics of some compound semiconductor materials, such as GaAs, AlGaAs, GaN, InGaN and AlGaInP, and radiate colored lights from the LED chips when electrically activated.

The characteristics of such LED packages are typically determined in accordance with colors of emitted lights, luminance, and a viewing angle thereof. Such characteristics of LED packages are primarily determined by the physical and chemical characteristics of compound semiconductor materials of LED chips, and secondarily determined by their package structures for seating the LED chips therein. In the prior art, the improvement in the characteristics of LED packages accomplished by the development of compound semiconductor materials of LED chips is undesirably limited. Therefore, improved structures of LED packages have been actively studied in recent years, in addition to study of the semiconductor materials of LED chips, in an effort to meet the requirement of a high luminous intensity and a desired viewing angle (it may also be referred to an angular distribution of the luminance). That is, while designing LED packages in recent years, it is desired to consider the compound semiconductor materials of LED chips as a primary design factor, and the structures of LED packages as a secondary design factor.

Particularly, both the luminance and an angular distribution of the luminance of LED packages are mainly affected by the secondary design factor, that is, the structures of the LED packages.

For example, a conventional lamp type LED package of FIG. 1a and a conventional surface mounted type LED package of FIG. 1b are compared with each other in their package structures as follows: In the case of the conventional lamp type LED package 10 of FIG. 1a with two leads 3a and 3b, the second lead 3b is provided at its top with a metal electrode surface, which is depressed to form a depression with inclined side surfaces having a predetermined inclination angle. An LED chip 5 is seated in the depression of the metal electrode surface. The two leads 3a and 3b with the LED chip 5 are packaged by a hemispherical casing 7 of transparent mold resin, thus producing a lamp type LED package 10. The conventional surface mounted type LED package 20 of FIG. 1b consists of a molded package body 11 of epoxy resin, and an LED chip 15 mounted on the surface of the body 11 at a chip mounting area. The LED chip 15 is connected to an electrode (not shown) through a plurality of wires 13.

In the conventional lamp type LED package 10, the hemispherical casing 7 acts as a lens capable of controlling the angular distribution of luminance. Particularly, the hemispherical casing 7 controls the angular distribution of luminance in a way such that the distribution becomes narrow, thus increasing the luminous intensity at a predetermined angle. In addition, the light radiated from the LED chip 5 is reflected by the metal electrode surface of the second lead 3b, thus increasing the luminous intensity of the LED chip 5. In comparison with such a lamp type LED package 10, the surface mounted type LED package 20 has a wider angular distribution of luminance and a lower luminous intensity. It is thus noted that the package structures affect the luminance and the angular distribution of the luminance of LED packages. Therefore, in an effort to accomplish desired characteristics of LED packages, there has been proposed a surface mounted type LED package, with an additional light reflecting surface formed by coating metal on an inclined side surface of the chip mounting area of a molded package body and having a predetermined reflective angle.

Different from such LED packages having molded resin bodies, it is almost impossible to desirably control the luminance or the angular distribution of luminance of another type LED package, having a ceramic body consisting of laminated ceramic substrates and widely used in recent years. That is, the chip mounting area of such a ceramic body must be formed through a punching process, a laminating process, and a cutting process, different from the molded resin bodies having chip mounting areas formed through an resin injection molding process. It is thus very difficult to form a side surface of the chip mounting area of the ceramic body in such a way that the side surface has a desired reflective angle.

FIG. 2 is a sectional view of a conventional LED package having such a ceramic body. As shown in the drawing, the ceramic body of the LED package 30 consists of two ceramic substrates 21 and 22, each of which is formed by laminating a plurality of ceramic sheets. Of the two ceramic substrates 21 and 22, the lower substrate 21 is provided at its top surface with a chip mounting area for seating an LED chip 25 thereon. An electrode 23 extends outward from the edge of the chip mounting area to the lower surface of the lower ceramic substrate 21 to cover a part of the lower surface after passing over the side surfaces of the lower ceramic substrate 21. The LED chip 25 is electrically connected to the electrode 23 using a plurality of wires 27 through a wire bonding process. The upper ceramic substrate 22 is bonded to the top surface of the lower ceramic substrate 21, and forms a predetermined cavity surrounding the chip mounting area.

The cavity surrounding the chip mounting area of the ceramic body is formed through a punching process or a cutting process, so the inside surface of the ceramic body defining the cavity is formed as a vertical surface. Therefore, different from the LED packages having the molded resin bodies, it is difficult to form a coated metal layer on the vertical inside surface of the ceramic body. An additional inclined surface made of resin may be formed on the vertical inside surface of the ceramic body, with a metal layer coated on the inclined resin surface in an effort to overcome the above-mentioned problems. However, the inclined resin surface may be easily deformed, so it is almost impossible to form a desired reflecting surface on the ceramic body.

In the conventional LED packages having such ceramic bodies, it is only possible to control the luminance and the angular distribution of the luminance by changing the dimension of the chip mounting area and/or the thickness of the upper ceramic substrate determining the height of the cavity. Therefore, it is difficult to produce LED packages having ceramic bodies and meeting the requirement of a high luminous intensity and a desired angular distribution of luminance. However, the ceramic substrates of such LED packages have high heat conductivity and a high heat dissipation effect, thus effectively solving the problems of thermal degradation of LED packages and thermal stress of package bodies caused by heat radiated from LED chips. Therefore, it is desired to propose more effective LED packages, which use such ceramic substrates having a high heat conductivity and a high heat dissipation effect, and overcome the structural faults experienced in the conventional LED packages with ceramic bodies due to the vertical inside surface of the ceramic body and leading to difficulty in the control of luminance and angular distribution of the luminance of the LED packages.

SUMMARY OF THE INVENTION

Accordingly, the present invention has been made keeping in mind the above problems occurring in the prior art, and an object of the present invention is to provide an LED package, which has a ceramic body consisting of laminated ceramic substrates, with a reflective plate made of a thin metal sheet and attached on the vertical inside surface of the ceramic body defining the cavity of a chip mounting area, and which thus accomplishes an improved heat dissipation effect thereof, in addition to easily controlling its luminance and angular distribution of its luminance.

In order to accomplish the above objects, the present invention provides an LED package, comprising: a first ceramic substrate having a chip mounting area on a top surface thereof, and provided with a predetermined conductive pattern formed around the chip mounting area; at least one LED chip seated on the chip mounting area of the first ceramic substrate, and connected to the conductive pattern; a second ceramic substrate mounted on the first ceramic substrate and having a cavity at a position corresponding to the chip mounting area; and a reflective plate made of metal and provided in the cavity of the second ceramic substrate so as to surround the LED chip.

In the LED package, the reflective plate preferably has a cylindrical structure, with a diameter of the upper end thereof being larger than that of the lower end thereof.

In such a case, the reflective plate can control the angular distribution of luminance of the LED chip by changing the angle of inclination of the sidewall of the reflective plate, with the inclination of the sidewall being formed by a difference in the diameter between the upper and lower ends of the reflective plate. In addition, the reflective plate can control the luminance of the LED chip by changing the surface area surrounding the LED chip. Furthermore, the reflective plate can control the luminance of the LED chip by selecting a reflective plate made of metals with different reflectivities. Therefore, the present invention provides a variety of LED packages, which are produced using ceramic substrates and have the luminance and angular distribution of the luminance both being controlled as required by users.

In the LED package of this invention, the reflective plate is preferably mounted to the upper surface of the second ceramic substrate around the upper edge of the cavity, thus effectively dissipating heat to the outside of the LED package. In order to allow the reflective plate to effectively dissipate heat to the outside of the package, the mounting of the reflective plate to the upper surface of the second ceramic substrate is preferably accomplished by a silicone-based bonding agent having high heat conductivity.

In order to enhance the heat dissipation effect of the LED package, the LED chip is airtightly packaged by a molded insulating part, which is made of a transparent moldable material and connected to the reflective plate. In such a case, heat dissipated from the LED chip is effectively transferred to the reflective plate having such high heat conductivity. In the present invention, the transparent moldable material of the molded insulating part is selected from epoxy resin or silicone-based resin. Of course, it is possible to use another resin of high heat conductivity as the transparent moldable material of the molded insulating part.

It is more preferable to extend the upper edge of the reflective plate to a predetermined position on the upper surface of the second ceramic substrate, in an effort to more effectively dissipate heat from the reflective plate.

In another embodiment of this invention, the LED package has a hemispherical lens covering the top of the cavity of the second ceramic substrate. In such a case, it is possible to control the angular distribution of luminance of the LED chip by controlling the distribution of curvature of the lens. The hemispherical lens is preferably made of a polymeric material.

In the present invention, the first ceramic substrate preferably consists of a ceramic substrate part having a heat dissipating hole formed therethrough, and a ceramic sheet covering the heat dissipating hole at the upper surface of the ceramic substrate part. In such a case, both the chip mounting area and the conductive pattern are formed on the upper surface of the ceramic sheet. The heat dissipating hole of the ceramic substrate part is filled with metal paste.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1A:
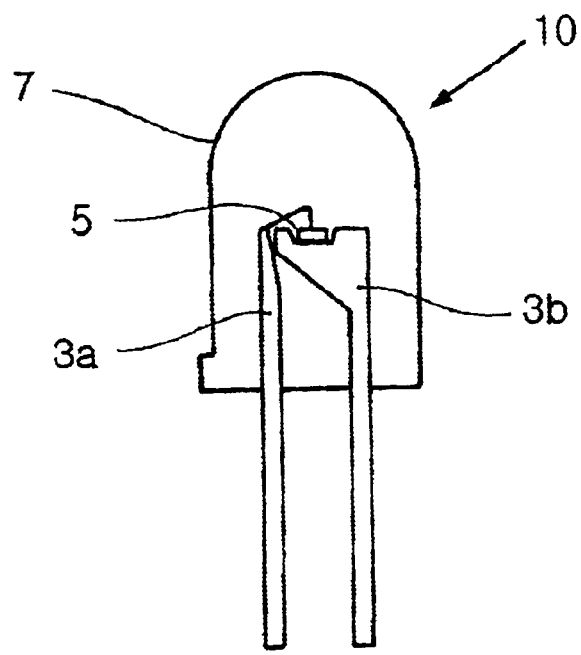
FIGS. 1a and 1b are views schematically showing the construction of conventional LED packages.
Figure 1B:
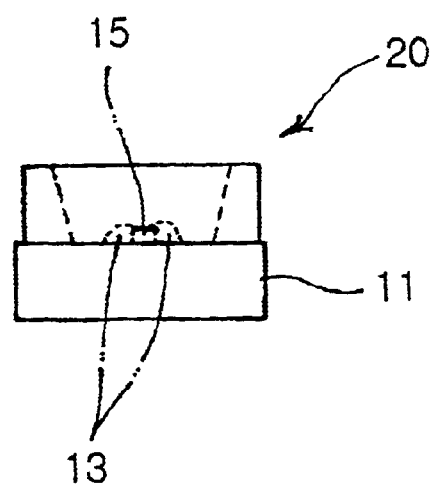
Figure 2:
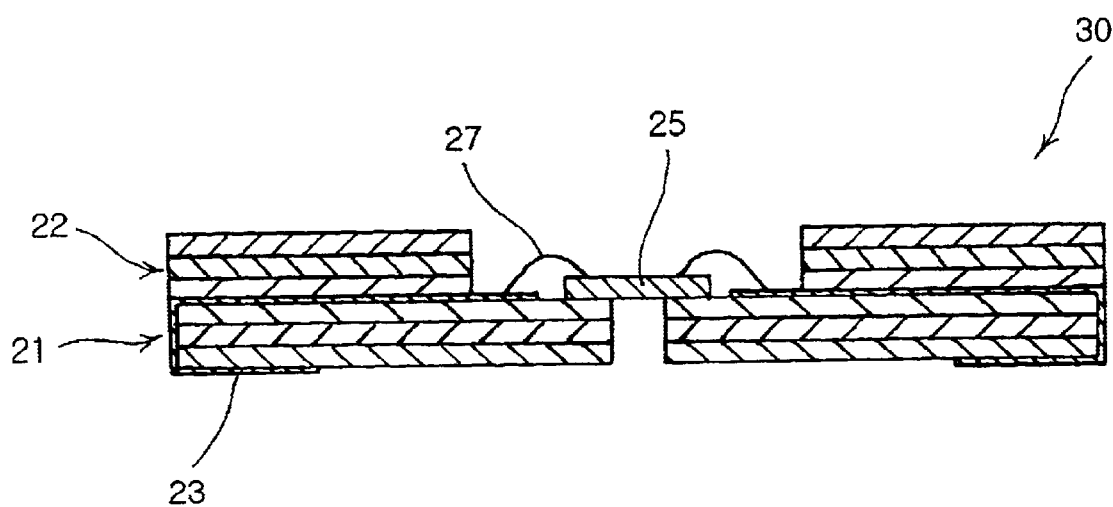
FIG. 2 is a sectional view of a conventional LED package produced using ceramic substrates.

Reference now should be made to the drawings, in which the same reference numerals are used throughout the different drawings to designate the same or similar components.

Figure 3:
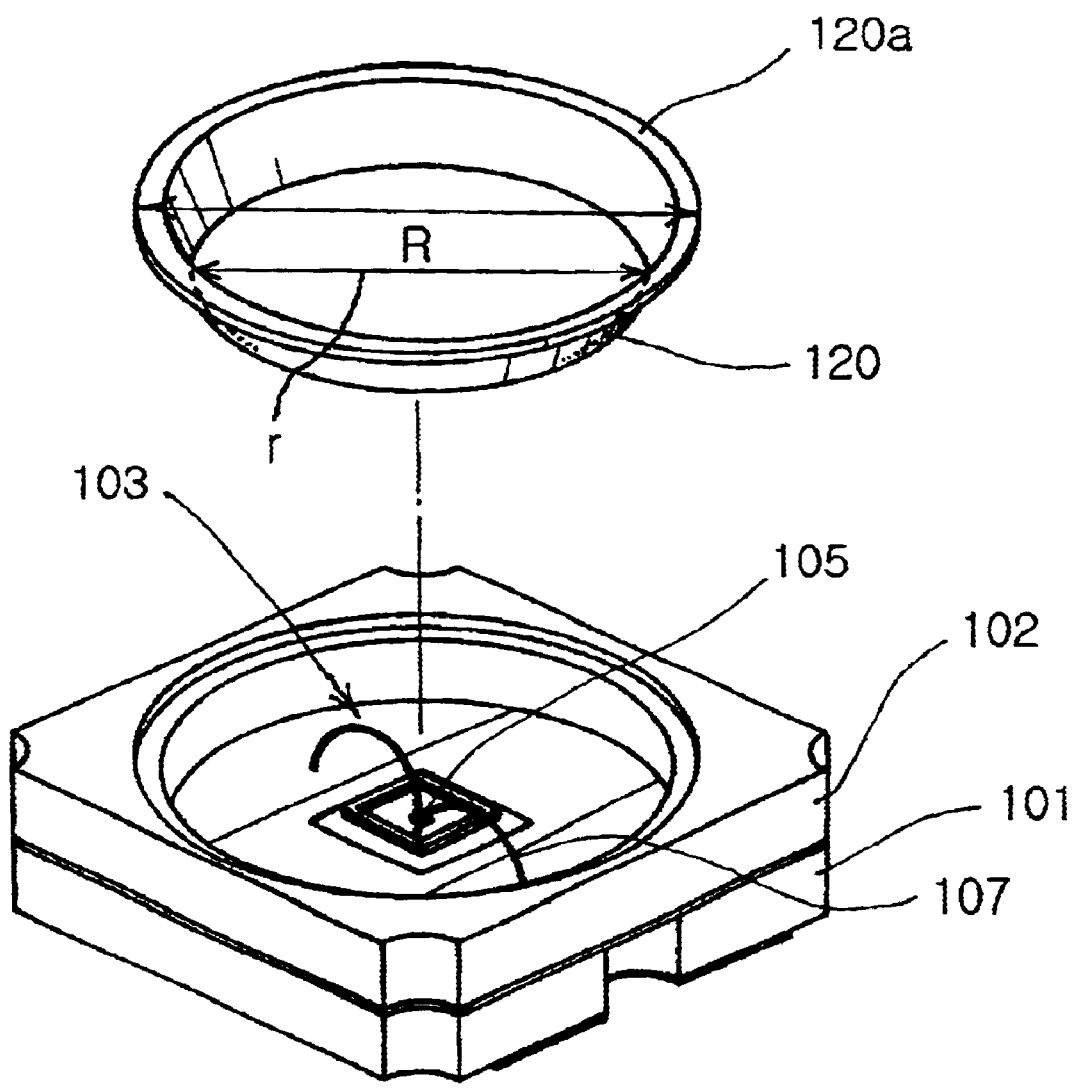
FIG. 3 is an exploded perspective view, showing the construction of an LED package having a reflective plate in accordance with the primary embodiment of the present invention.

FIG. 3 is an exploded perspective view, showing the construction of an LED package having a reflective plate in accordance with the primary embodiment of the present invention. This drawing shows the LED package, with the reflective metal plate 120 separated from the chip mounting area of the package body.

The reflective metal plate 120 is made of a thin metal sheet having a high reflectivity, and has a cylindrical shape as shown in the drawing. In the cylindrical reflective plate 120, the diameter "R" of the upper end is preferably larger than the diameter "r" of the lower end. In the present invention, it is possible to somewhat increase the luminous intensity of an LED chip by simply setting a cylindrical reflective plate in the chip mounting area without designing the reflective plate to have such a difference in the diameter between the upper and lower ends. However, it is more preferable to design the cylindrical reflective plate such that the reflective plate has a difference between the diameters "R" and "r" of its upper and lower ends and has a desired angular distribution of luminance and a desirably increased luminous intensity by controlling the diameter difference "R–r".

The reflective plate 120 is preferably manufactured using a thin copper sheet through an extrusion process or a forming process. However, it should be understood that the reflective plate 120 may be manufactured using another metal sheet in place of the thin copper sheet if the metal sheet has desirably high reflectivity and is so thin that the sheet is easily formed to a desired cylindrical shape through an extrusion process or a forming process.

During a process of manufacturing the reflective plate 120, it is preferable to form a support flange 120a along the upper edge of the reflective plate 120. In the preferred embodiment, one support flange 120a is integrally and continuously formed along the circular upper edge of the reflective plate 120. However, it should be understood that it is possible to form a predetermined number of support flanges on desired sections of the upper edge of the reflective plate 120 without affecting the functioning of this invention. When the reflective metal plate 120 having such a support flange 120a is set in the cavity above the chip mounting area of the LED package, it is possible to stably rest the reflective plate 120 on the upper surface of a ceramic substrate at the support flange 120a. Therefore, the reflective plate 120 is more stably attached to the LED package. In such a case, a silicone-based bonding agent is preferably used for attaching the reflective plate 120 to the LED package, in an effort to improve the heat dissipation effect of the LED package, as will be described in more detail later herein.

As shown in FIG. 3, the reflective metal plate 120 is easily set in the cavity above the chip mounting area of the LED package. The LED package of this invention is described in more detail as follows: The LED package manufactured using ceramic substrates according to this invention comprises a first ceramic substrate 101, which has a chip mounting area on its top surface for seating an LED chip 105 thereon. An electrode 103 is formed on the top surface of the first ceramic substrate 101, and is connected to the LED chip 105 through a plurality of wires 107. The electrode 103 is formed by a conductive pattern. A second ceramic substrate 102 is mounted on the first ceramic substrate 101, and has a cavity at a position corresponding to the chip mounting area. The first and second ceramic substrates 101 and 102 may be preferably made of alumina or SiC. The body of the LED package of this invention is made of the ceramic substrates 101 and 102 as described above, so the side surface of the cavity formed in the second ceramic substrate 102 to surround the chip mounting area of the first ceramic substrate 101 is inevitably formed as a vertical surface in the same manner as that described for the prior art. In the present invention, the vertical side surface of the cavity is covered with the reflective metal plate 120. In an operation of this LED package, the reflective plate 120 surrounding the LED chip reflects light radiated from the LED chip, so the luminous intensity of the LED chip is increased. In such a case, it is possible to obtain a desired angular distribution of luminance of the LED chip by controlling the inclination angle of the side surface of the reflective plate 120 during a process of manufacturing the plate 120. In an effort to increase the reflectivity of the reflective plate 120, a coated layer, made of Sn, SnPb or Ag, may be formed on the reflective plate 120.

In the present invention, the reflective metal plate may act as a heat sink for dissipating heat from the LED chip to the outside of the LED package, in addition to its original function of controlling the luminance of the LED chip and the angular distribution of the luminance. The reflective metal plate acting as a heat sink is shown in FIGS. 4a and 4b showing the second embodiment of this invention.

Figure 4A:
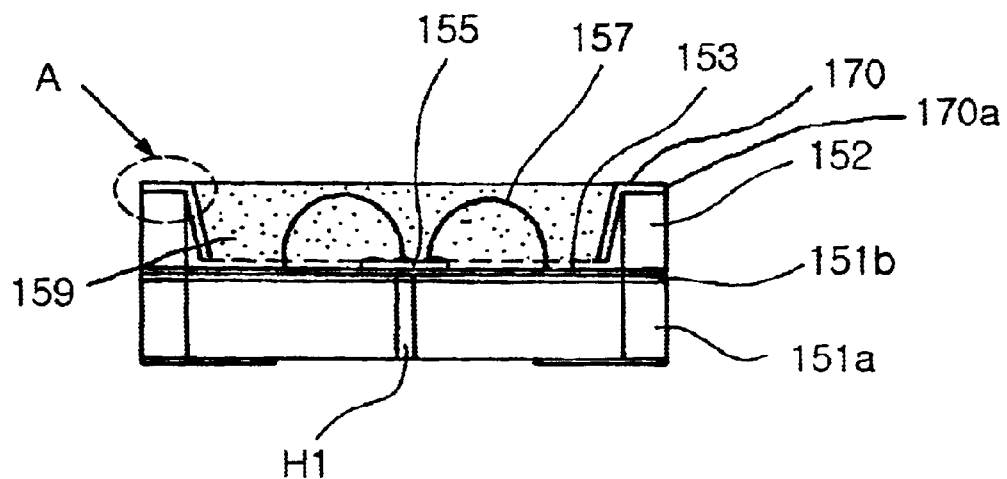
FIGS. 4a and 4b are views of an LED package in accordance with the second embodiment of the present invention.

FIG. 4a shows the cross-sectioned structure of the LED package according to the second embodiment of this invention. In the same manner as that described for the primary embodiment of FIG. 3, the LED package of this second embodiment comprises two ceramic substrates: a first ceramic substrate 151 and a second ceramic substrate 152 mounted to the top surface of the first substrate 151. The first ceramic substrate 151 has a chip mounting area on its top surface for seating an LED chip 155 thereon. A conductive pattern is formed on the top surface of the first ceramic substrate 151 at a position around the chip mounting area, thus forming an electrode 153. The electrode 153 is connected to the LED chip 155 through a plurality of wires 157, thus feeding drive electric power to the chip 155. In this embodiment, the conductive pattern of the electrode 153 preferably extends to the lower surface of the first ceramic substrate 151 after passing over the side surfaces of the substrate 151 as shown in the drawing. The conductive pattern of the electrode 153 is preferably made of an Ag/Ni/Au layer.

The second ceramic substrate 152 has a cavity at a position corresponding to the chip mounting area of the first ceramic substrate 151. The second ceramic substrate 152 is mounted on the top surface of the first ceramic substrate 151, thus forming a chip mount space for seating the LED chip 155 therein. In this second embodiment, a heat dissipating hole H1 is preferably formed through the first ceramic substrate 151 at a position corresponding to the chip mounting area, thus effectively dissipating heat from the LED chip 155 to the outside of the LED package. In the LED package having such a heat dissipating hole H1 at the first ceramic substrate 151, it is necessary to cover the top of the heat dissipating hole H1 in an effort to provide a chip mounting area. Therefore, the first ceramic substrate 151 of this LED package consists of a ceramic substrate part 151a having the heat dissipating hole H1 formed therethrough, and a ceramic sheet 151b covering the top surface of the ceramic substrate part 151a as well as the top of the heat dissipating hole H1. The ceramic sheet 151b thus provides a desired chip mounting area, and covers the top of the heat dissipating hole H1.

Figure 4B:
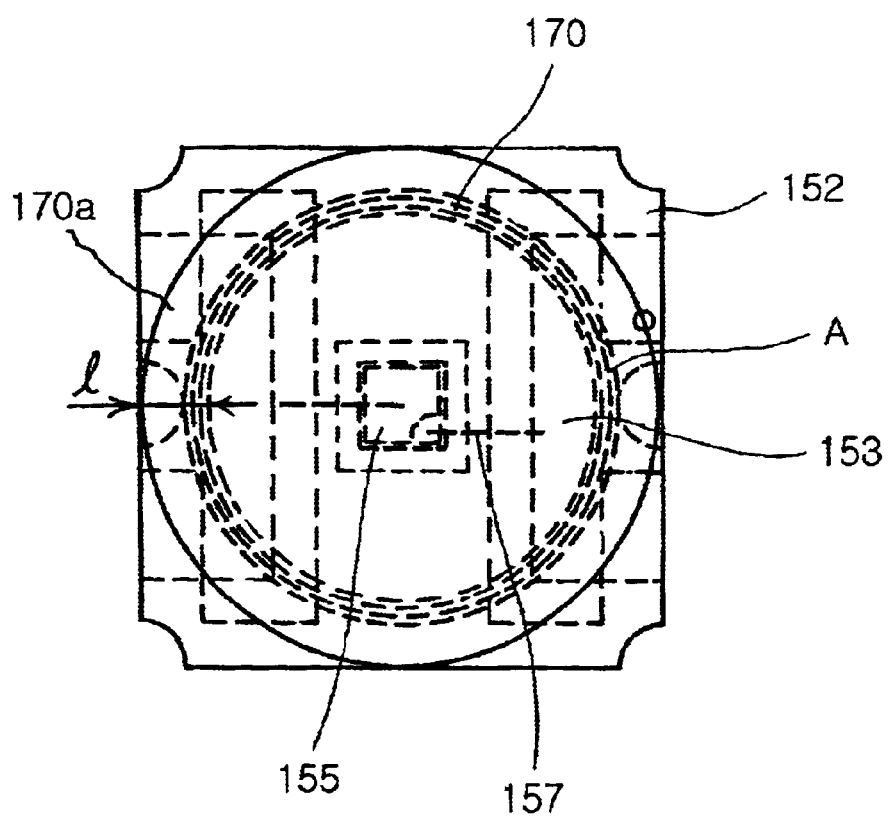

As shown in FIG. 4b which is a plan view of the LED package according to the second embodiment of this invention, a reflective metal plate 170 is set in the chip mount space formed by the cavity of the second ceramic substrate 152, and surrounds the LED chip 155 seated on the chip mounting area. In the second embodiment, the reflective plate 170 has a support flange 170a, at which the reflective plate 170 is rested on the top surface of the second ceramic substrate 152 and which is attached to the area "A" of the top surface of the substrate 152 using a silicone-based bonding agent having high thermal conductivity. The support flange 170a formed along the top edge of the reflective plate 170 has a substantial width "1", which allows the support flange 170a to more effectively dissipate heat from the reflective plate 170 to the outside of the LED package. In such a case, heat is primarily transferred from the LED chip 155 to the reflective plate, and is secondarily dissipated to the surroundings of the LED package through the support flange 170a.

An insulating resin is contained in the chip mount space of the LED package according to the second embodiment, thus forming an insulating part 159. This insulating part 159 is connected to the reflective plate 170, and allows more effective heat transfer from the LED chip 155 to the reflective plate 170. The insulating part 159 is preferably made of transparent epoxy resin or silicone-based resin. However, it should be understood that the insulating part 159 may be formed using another moldable insulating material if the material is transparent and has high heat conductivity.

In the LED package of FIGS. 4a and 4b, the reflective metal plate 170 is collaterally used as an effective heat dissipating means, which receives heat from the LED chip 155 through the insulating part 159 and dissipates the heat to the surroundings of the package through the support flange 170a rested on the top surface of the second ceramic substrate 152.

Figure 5:
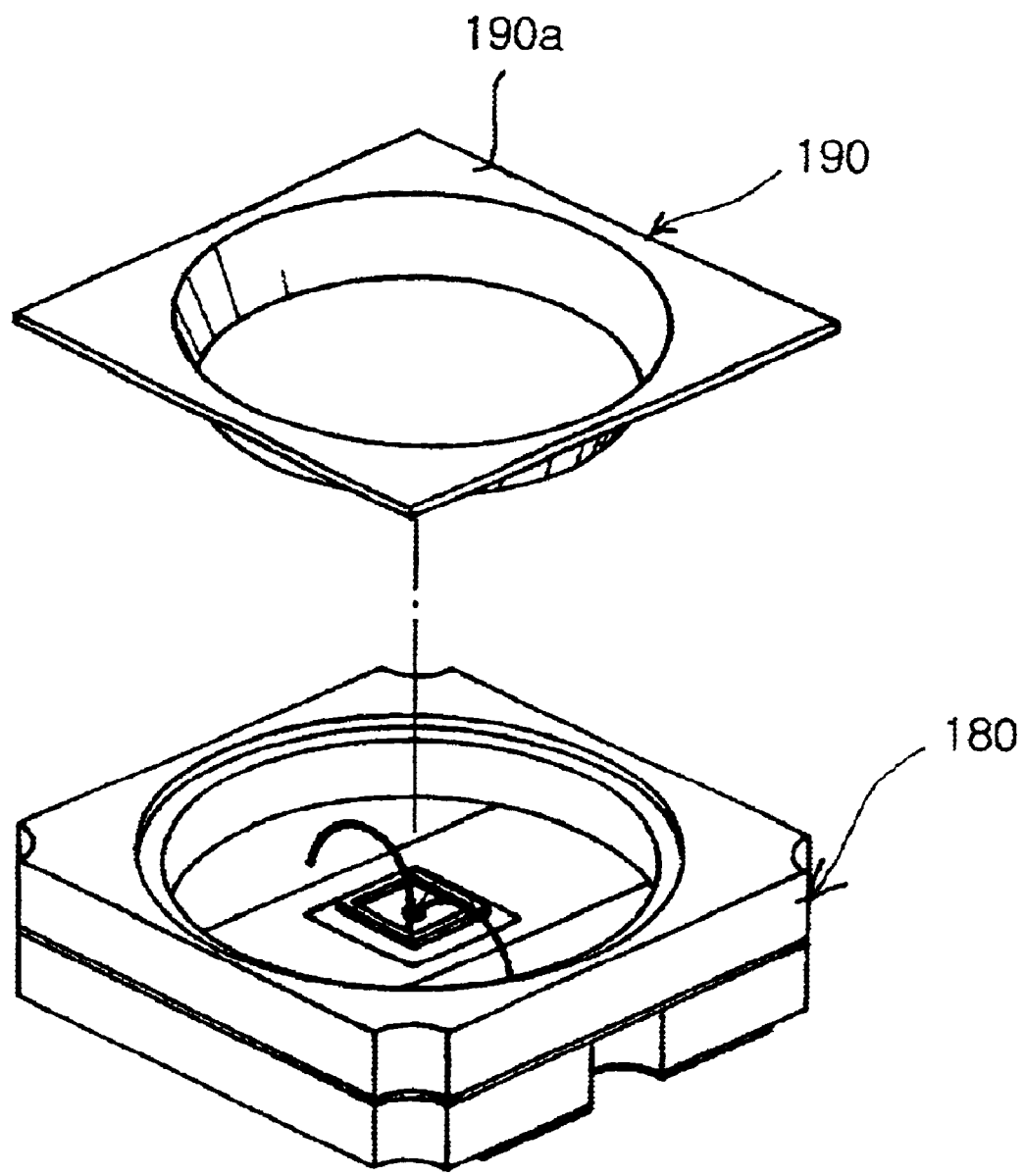
FIG. 5 is an exploded perspective view, showing the construction of an LED package having a reflective plate in accordance with the third embodiment of the present invention.

FIG. 5 shows an LED package having a reflective metal plate 190 according to the third embodiment of the present invention. Different from the circular support flange 170a of the reflective metal plate 170 according to the second embodiment, the support flange 190a of the reflective metal plate 190 of this third embodiment has a rectangular profile similar to that of the LED package. The surface area of this support flange 190a having such a rectangular profile is larger than that of either the support flange 120a of FIG. 3 or the support flange 170a of FIGS. 4a and 4b, so it more effectively dissipates heat to the outside of the package. In the present invention, the shape of the support flange of the reflective metal plate may be somewhat freely changed in accordance with the profile of the LED package and a required heat dissipation effect without affecting the functioning of this invention.

Figure 6:
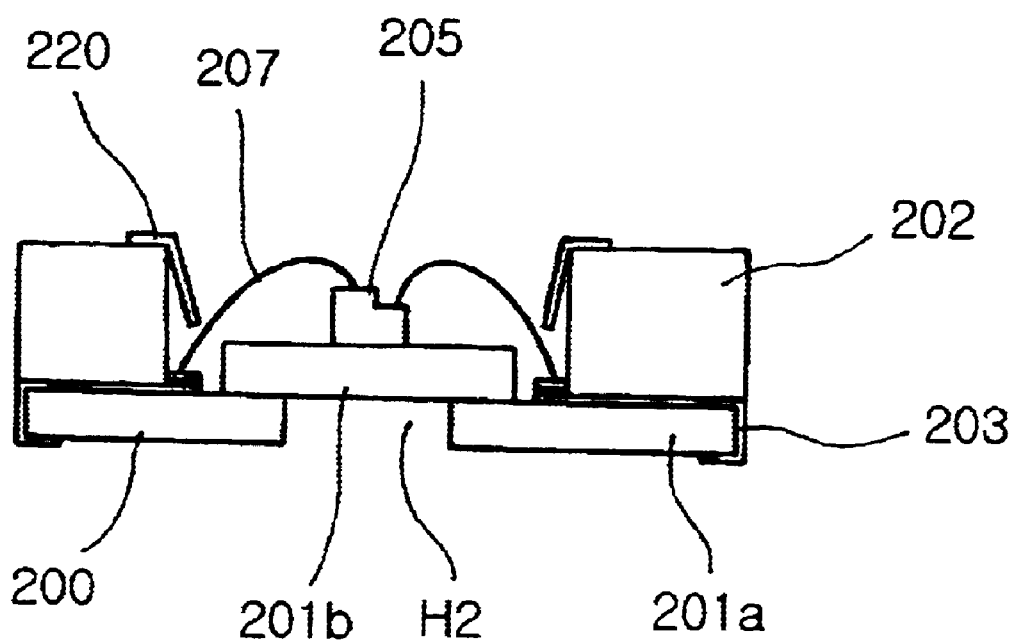
FIG. 6 is a sectional view of an LED package according to the fourth embodiment of the present invention.

In addition, the reflective metal plate of this invention may be preferably used in LED packages having a variety of ceramic substrate structures with vertical inside surfaces defining the chip mounting spaces of the packages. FIG. 6 is a sectional view of an LED package according to the fourth embodiment of the present invention.

In the fourth embodiment of FIG. 6, the LED package has a first ceramic substrate, the structure of which is different from that of FIGS. 4a and 4b. That is, the second ceramic substrate 202 of this LED package has a cavity in the same manner as that described for the second embodiment of FIGS. 4a and 4b. However, the first ceramic substrate 201 of this fourth embodiment consists of lower and upper ceramic substrate parts 201a and 201b. The lower ceramic substrate part 201a has a heat dissipating hole H2, which is formed through the substrate part 201a and has a substantial diameter. The upper ceramic substrate part 201b has a size suitable for being received in the chip mounting space formed by the cavity of the second ceramic substrate 202. The upper ceramic substrate part 201b acts as a ceramic sheet, which covers the top of the heat dissipating hole H2 and forms a chip mounting area for seating an LED chip 205 thereon. In this fourth embodiment, a cylindrical reflective metal plate 220 is preferably set in the chip mounting space of the package such that the plate 220 is rested on and mounted to the top surface of the second ceramic substrate 202 at its support flange. In the cylindrical reflective plate 220, the diameter of the top end is larger than that of the lower end.

In a brief description, the package structure according to this invention is preferably and easily used in any type of LED packages if the LED packages have a chip mounting space formed by ceramic substrates.

Figure 7:
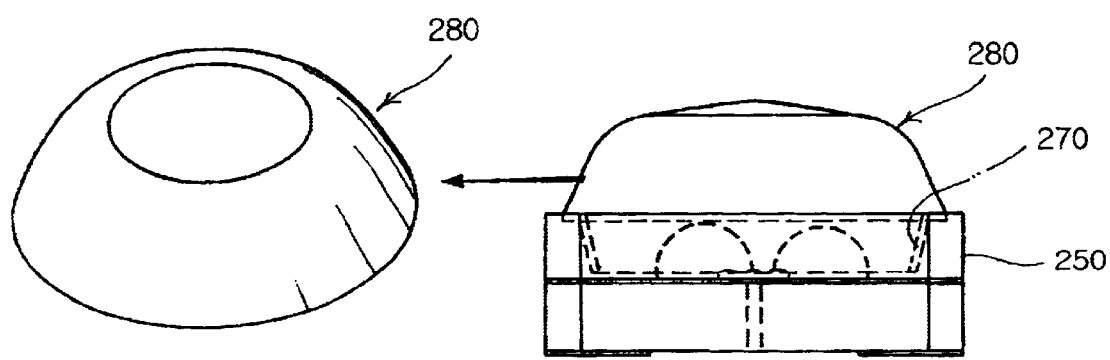
FIG. 7 is a view of an LED package in accordance with the fifth embodiment of the present invention.

FIG. 7 is a view of an LED package in accordance with the fifth embodiment of this invention. As shown in FIG. 7, the general shape of the LED package 250 of this fifth embodiment remains the same as that described for the LED package according to the second embodiment of FIGS. 4a and 4b, but the top of the chip mounting space having a reflective metal plate 270 is covered with a hemispherical lens 280. This hemispherical lens 280 is designed in consideration of the hemispherical casing used in the conventional lamp type LED package of FIG. 1a. The hemispherical lens 280 is preferably made of a polymeric material. This hemispherical lens 280 is preferably used as a means for controlling the light emitting angle of an LED chip of the package 250 by changing the distribution of curvature of the lens 280.

Figure 8:
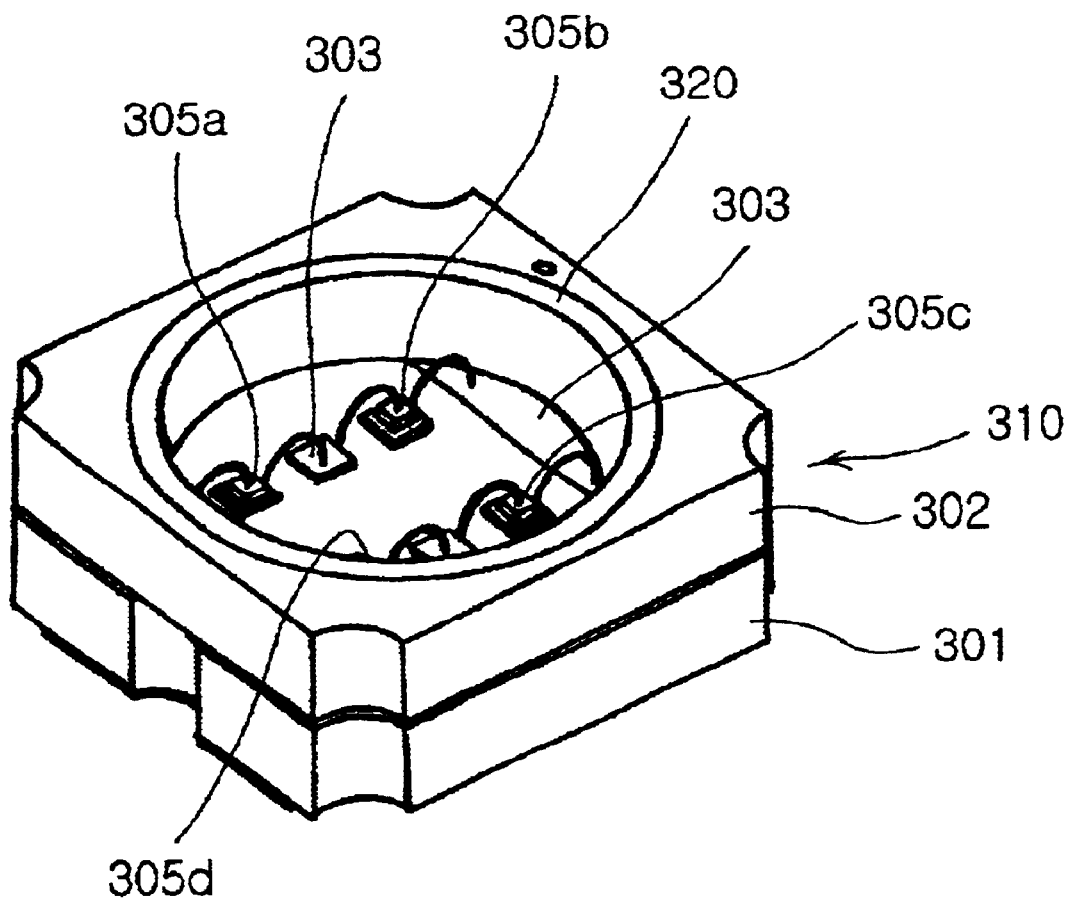
FIG. 8 is a perspective view of an LED package in accordance with the sixth embodiment of the present invention.

The package structure of this invention may be preferably used in another type LED package having a plurality of LED chips. FIG. 8 is a perspective view of an LED package having both a reflective plate and a plurality of LED chips in accordance with the sixth embodiment of this invention.

As shown in FIG. 8, the LED package 310 of the sixth embodiment consists of first and second ceramic substrates 301 and 302, and seats four LED chips in its chip mounting space formed by the ceramic substrates 301 and 302. The four LED chips 305a, 305b, 305c and 305d of this embodiment are connected to a plurality of electrodes 303 by means of a plurality of wires. In the same manner as that described for the primary to fifth embodiments, a reflective metal plate 320 is set in the chip mounting space of the package 310 to surround the four LED chips 305a, 305b, 305c and 305d.

As described above, the present invention provides an LED package, which is made of ceramic substrates and has a reflective metal plate set in a chip mounting space formed by the ceramic substrates. In the LED package of this invention, the chip mounting space is formed in the ceramic substrates of the package through a punching process, the space has a vertical side surface. However, the reflective plate made of a thin metal plate is set in the chip mounting space, and so it is possible to somewhat freely control the luminous intensity of an LED chip and the angular distribution of luminance. The reflective metal plate of this invention also collaterally acts as a heat sink effectively dissipating heat from the LED chip to the surroundings of the LED package.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A light emission diode package, comprising:
   a first ceramic substrate having a chip mounting area on a top surface thereof, and a predetermined conductive pattern formed around the chip mounting area;

at least one light emission diode (LED) chip seated on said chip mounting area of the first ceramic substrate, and connected to the conductive pattern;

a second ceramic substrate mounted on said first ceramic substrate and having a cavity in a position corresponding to said chip mounting area; and a reflective plate made of metal and provided in said cavity of the second ceramic substrate so as to surround the LED chip;

wherein said reflective plate has a support flange at an upper end thereof and is rested on an upper surface of said second ceramic substrate at said support flange.

2. The light emission diode package according to claim 1, wherein said support flange is integrally formed along an upper edge of the reflective plate.

3. The light emission diode package according to claim 1, wherein said support flange extends from the upper end of the reflective plate to a predetermined position on the upper surface of the second ceramic substrate, thus effectively dissipating heat from the reflective plate.

4. A light emission diode package, comprising:

a first ceramic substrate having a chip mounting area on a too surface thereof, and a predetermined conductive pattern formed around the chip mounting area;

at least one light emission diode (LED) chip seated on said chip mounting area of the first ceramic substrate, and connected to the conductive pattern;

a second ceramic substrate mounted on said first ceramic substrate and having a cavity in a position corresponding to said chip mounting area; and a reflective plate made of metal and provided in said cavity of the second ceramic substrate so as to surround the LED chip;

wherein said first ceramic substrate consists of a ceramic substrate part having a heat dissipating hole formed therethrough, and a ceramic sheet covering the heat dissipating hole at an upper surface of said ceramic substrate part, and both the chip mounting area and the conductive pattern are formed on an upper surface of said ceramic sheet.

5. The light emission diode package according to claim 4, wherein said heat dissipating hole of the ceramic substrate part is filled with metal paste.

6. A light emission diode package, comprising:

a first ceramic substrate having a chip mounting area on a top surface thereof, and a predetermined conductive pattern formed around the chip mounting area;

at least one light emission diode (LED) chip seated on said chip mounting area of the first ceramic substrate, and connected to the conductive pattern;

a second ceramic substrate mounted on said first ceramic substrate and having a cavity in a position corresponding to said chip mounting area; and a reflective plate made of metal and provided in said cavity of the second ceramic substrate so as to surround the LED chip;

wherein said conductive pattern is made of an Ag/Ni/Au layer.

* * * * *